(12) United States Patent
Otremba

(10) Patent No.: US 8,124,983 B2
(45) Date of Patent: Feb. 28, 2012

(54) POWER TRANSISTOR

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 393 days.

(21) Appl. No.: 12/200,224

(22) Filed: Aug. 28, 2008

(65) Prior Publication Data

US 2010/0051963 A1 Mar. 4, 2010

(51) Int. Cl.
*H01L 31/0312* (2006.01)
*H01L 31/0328* (2006.01)
*H01L 31/0336* (2006.01)
*H01L 31/072* (2006.01)
*H01L 31/109* (2006.01)

(52) U.S. Cl. ......... 257/77; 257/192; 257/196; 257/197; 257/E21.41; 257/E23.083; 257/E29.085

(58) Field of Classification Search .............. 257/77, 257/192, 196, 197, E21.41, E23.083, E29.085
See application file for complete search history.

(56) References Cited

U.S. PATENT DOCUMENTS

| 5,939,754 A | 8/1999 | Hoshi |
| 6,025,233 A * | 2/2000 | Terasawa ................ 438/270 |
| 7,436,004 B2 * | 10/2008 | Shimoida et al. ............ 257/183 |
| 2006/0076660 A1 | 4/2006 | Boschlin et al. |

FOREIGN PATENT DOCUMENTS

| DE | 19953883 | 5/2001 |
| GB | 2317054 | 3/1998 |
| JP | 2002231820 | 8/2002 |

OTHER PUBLICATIONS

"Power Semiconductors", Technical Information, Technologies and Charateristics Data. Mar. 16, 2004.

* cited by examiner

*Primary Examiner* — David S Blum
(74) *Attorney, Agent, or Firm* — Dicke, Billig & Czaja, PLLC

(57) ABSTRACT

A power transistor includes a first terminal, a second terminal and a control terminal. A support layer is formed of a first material having a first bandgap. An active region is formed of a second material having a second bandgap wider than the first bandgap, and is disposed on the support layer. The active region is arranged to form part of a current path between the first and second terminal in a forward mode of operation. The active region includes at least one pn-junction.

22 Claims, 5 Drawing Sheets

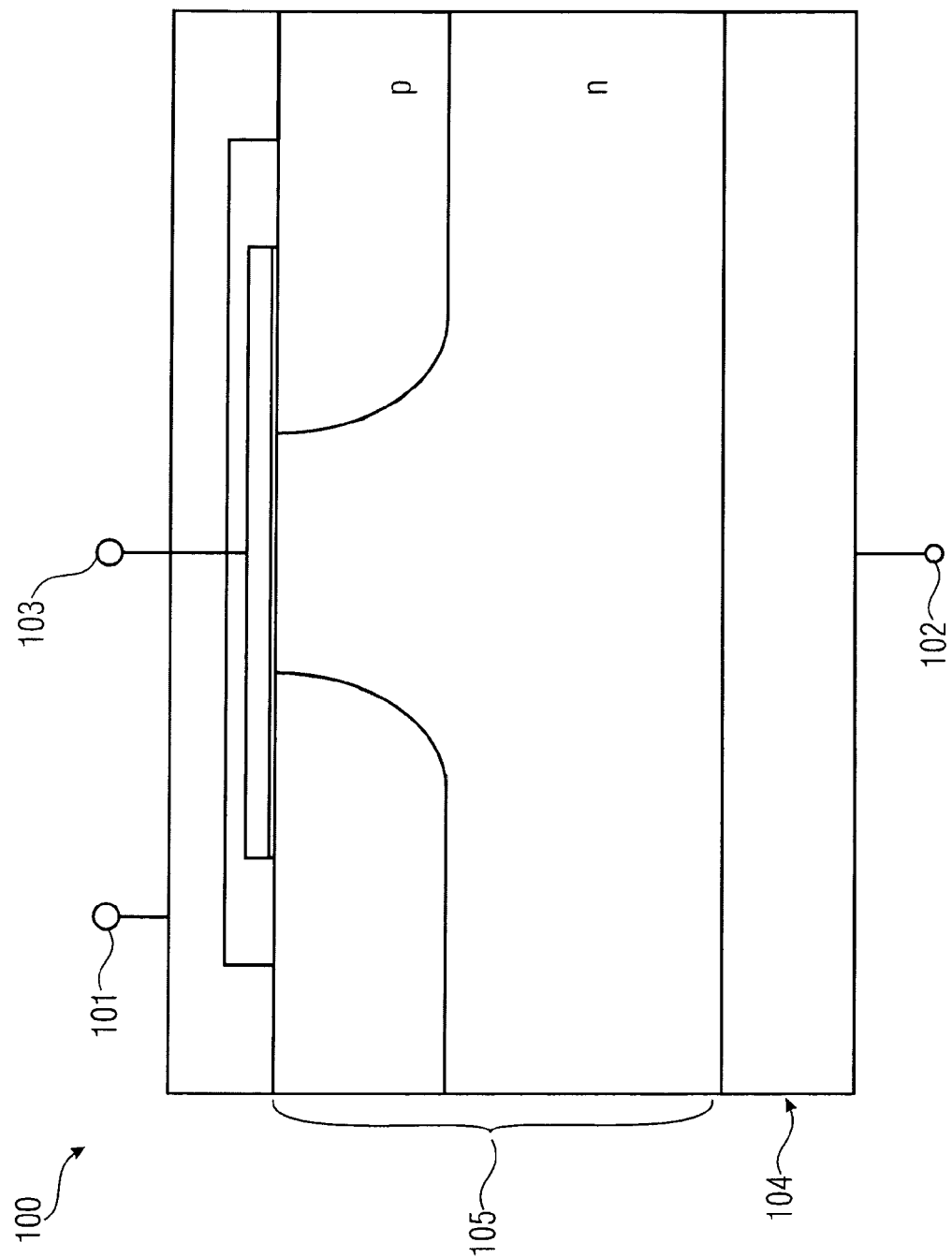

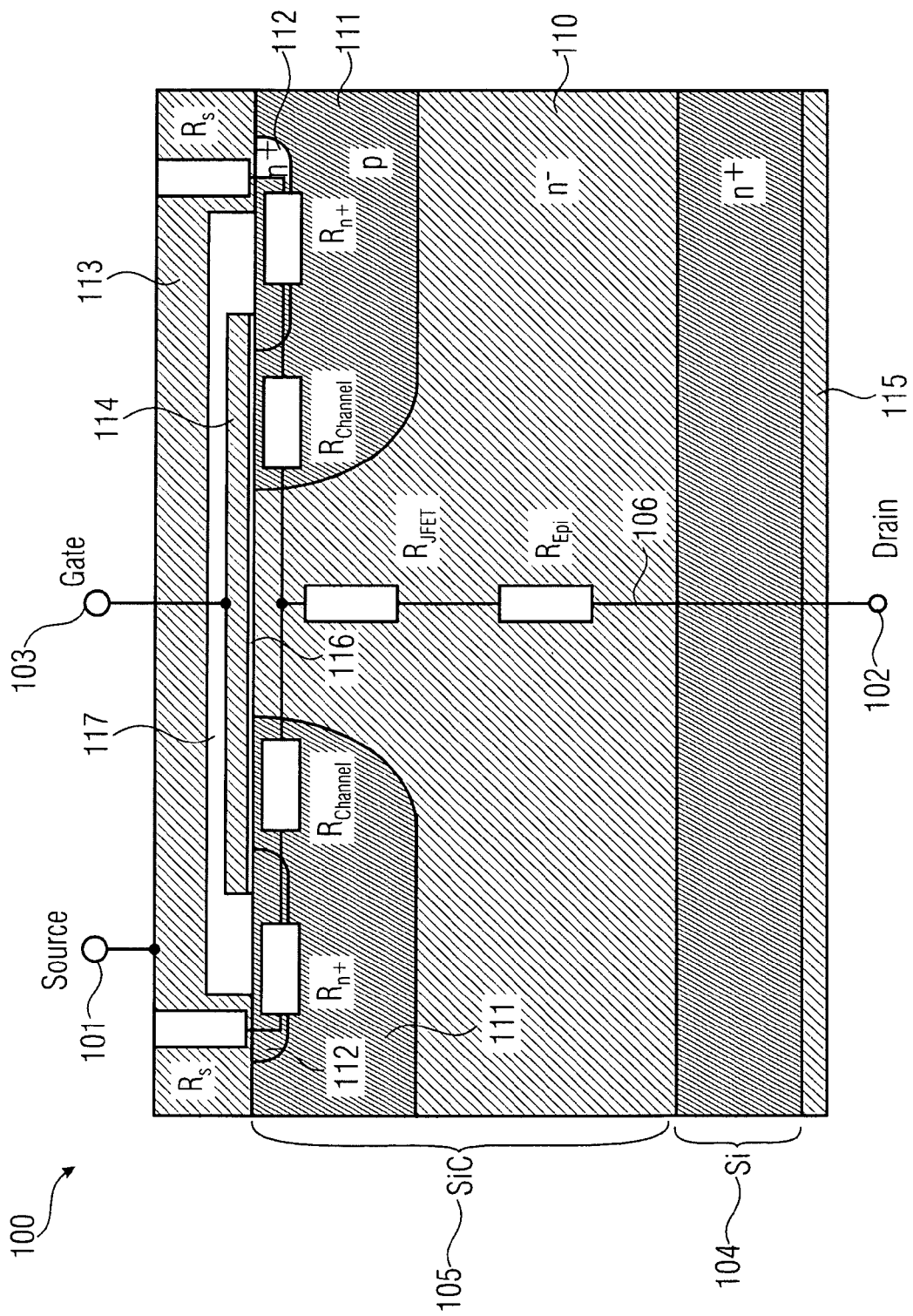

POWER TRANSISTOR

BACKGROUND

One or more embodiments relate to a power transistor including a support layer formed of a first material and an active region formed of a second material.

Power MOSFETs have a maximum specified drain to source voltage, beyond which breakdown may occur. Exceeding the breakdown voltage causes the device to turn on, potentially damaging it and other circuit elements due to excessive power dissipation. The drain current should stay below a certain specified value which is limited by heating due to resistive losses in internal components such as bond wires or metal layers. The junction temperature of the MOSFET should stay under a specified maximum value for the device to function reliably. The maximum value is given by the power dissipation times the junction-to-case thermal resistance, which is intrinsic to the device and depends on the material of the device. As conventional power transistors are formed of silicon the material characteristics of silicon are effecting limits of operation for these power transistors.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1a illustrates one embodiment of a power transistor.

FIG. 1b illustrates a layer diagram of a power transistor according to one embodiment.

DETAILED DESCRIPTION

Figure 2:
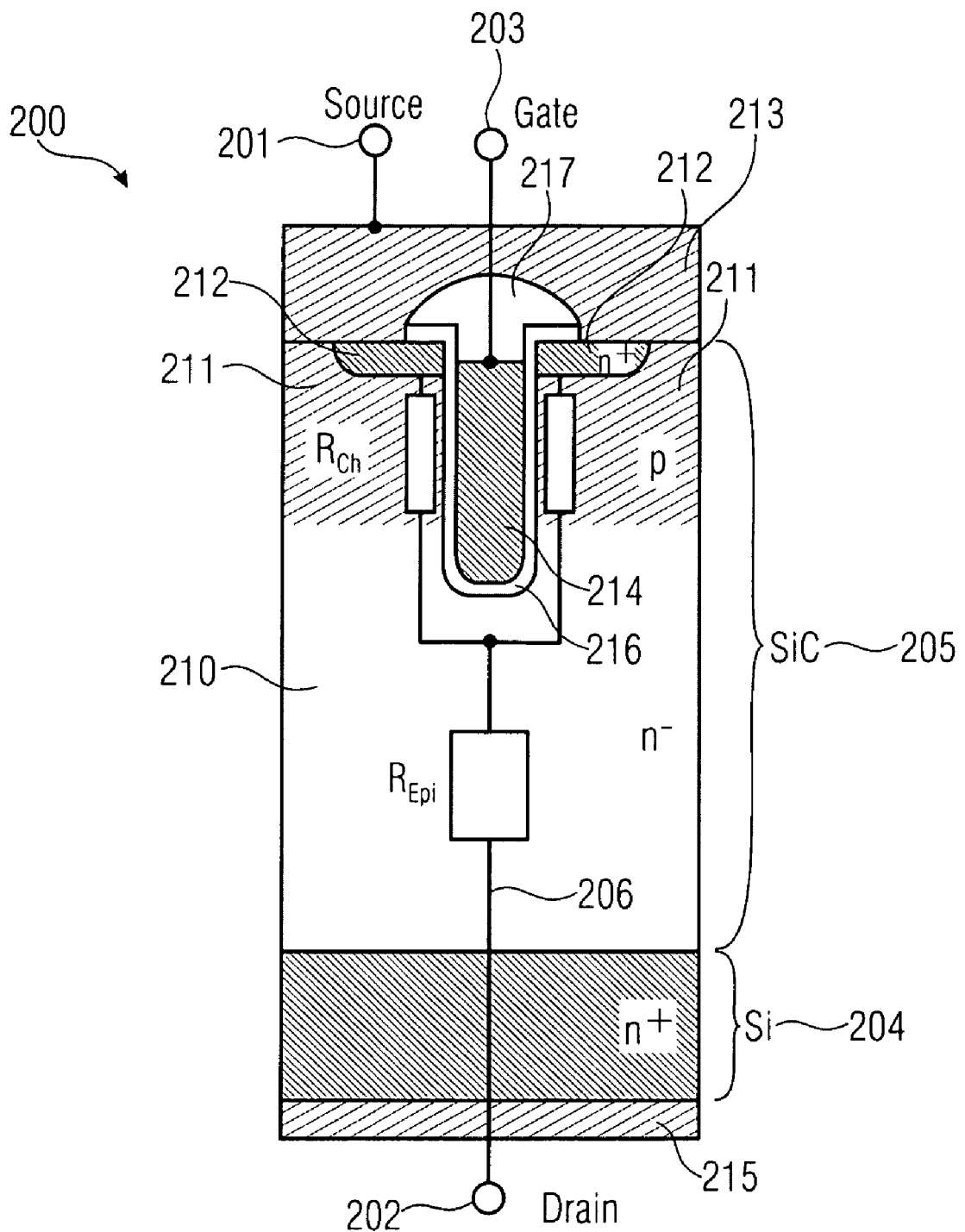
FIG. 2 illustrates a layer diagram of a power transistor according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

With reference to the accompanying FIGS. 1-4 embodiments of a power transistor and a power package will be described.

FIG. 1a illustrates one embodiment of a power transistor 100 including a first terminal 101, a second terminal 102 and a control terminal 103. The power transistor 100 further includes a support layer 104 formed of a first material having a first bandgap and an active region 105 of a second material having a second bandgap wider than the first bandgap. The active region 105 is disposed on the support layer 104 and is arranged to form part of a current path between the first terminal 101 and second terminal 102 in a forward mode of operation. The active region 105 includes at least one pn-junction.

FIG. 1b illustrates a power transistor including a layer diagram of a vertical MOSFET cell according to one embodiment. The vertical MOSFET cell 100 includes a source terminal 101 corresponding to a first terminal, a drain terminal 102 corresponding to a second terminal and a gate terminal 103 corresponding to a control terminal. The vertical MOSFET cell 100 further includes a support layer 104 formed of silicon and an active region 105 or layer, respectively on a surface of the support layer 104. In one embodiment, the active region 105 is formed of silicon carbide (SiC). The source terminal 101 is connected to a source metallization layer 113 or source electrode, respectively, which is formed on a surface of the active region 105. The source metallization layer 113 includes a cavity, wherein a gate electrode 114 is arranged such that the gate electrode 114 is isolated from the active region 105 by a gate oxide layer 116 which is arranged on the surface of the active region 105 between the gate electrode 114 and the active region 105. The cavity of the source metallization layer 113 is filled with an insulation material forming the gate source insulation layer 117 which is insulates the gate electrode 114 from the source electrode 113. The drain terminal 102 is connected to a drain electrode 115 arranged on a backside of the support layer 104. The drain electrode 115 forms a metallization layer providing an electrical and thermal connection of the drain terminal 102 to the support layer 104.

The active region 105 formed of silicon carbide includes a $n^-$-doped epitaxial layer 110 or drift zone, respectively, which is arranged on the support layer 104 and extends to the gate oxide layer 116 below the gate electrode 114. The active region 105 further includes two p-wells 111, in one embodiment made of p-doped SiC, arranged on top of the active region 105 in two separated regions such that the p-wells 111 are contacting the gate oxide layer 116 below the gate electrode 114 and the source electrode 113 at the surface of the active region 105. The active region 105 further includes two $n^+$-zones 112 made of $n^+$-doped SiC and formed as wells inside the p-wells 111 having a common surface with the p-wells 111. The $n^-$-doped zones 112 are in contact with the gate oxide layer 116 below the gate electrode 114, with the gate source insulation layer 117 and with the source electrode 113.

The $n^-$-doped epitaxial layer 110, the p-wells 111 and the $n^+$-zones 112 form a n-channel active region of a power MOSFET and pn-junctions are formed in the active region 105. The gate electrode 114 is configured to control the charge carrier diffusion in a channel region ($R_{channel}$). Depending on the potential of the gate electrode 114, a current path 106 is formed between the source terminal 101 and the drain terminal 102. The current path 106 or the drain source current, respectively, depends on a source resistance $R_S$, a $n^+$ diffusion resistance $R_{n+}$, a drift zone resistance $R_{EPI}$, an intrinsic JFET resistance $R_{JFET}$ and a channel resistance $R_{channel}$.

The support layer 104 formed of silicon includes a $n^+$-doped silicon layer. The size of the support layer 104 is smaller than the size of the active region 105 such that a higher amount of material of the vertical MOSFET cell 100 is made of silicon carbide. A small support layer 104 formed of silicon compared to the active region 105 formed of SiC effects a further improvement of the on-state resistance. The active region 105 formed of silicon carbide provides lower static and dynamic losses and enables much larger power densities than possible with an active region made of silicon. Due to its very tight crystal structure, silicon carbide has a higher band gap than silicon and a greater breakdown field strength, which makes it possible to realize the same blocking ability with thinner semiconductor layers. As silicon has a breakdown field strength of $3\times10^5$ V/cm silicon carbide has a breakdown field strength in the range of $22\times10^5$ V/cm to $25\times10^5$ V/cm depending on the respective crystal structure of silicon carbide. For the same blocking voltage, the around 10 times larger breakdown field strength of silicon carbide enables a doping concentration two orders of magnitude lower than for silicon and an active region 105 thickness which can be reduced by one order of magnitude. Therefore, about 300 times smaller drift zone resistances ($R_{EPI}$) can be realized. As a result of the lower intrinsic charge carrier concentration, even at very high temperatures, the reverse leakage currents are very low. Therefore, the vertical MOSFET cell 100 is well suited for applications in high temperature environments. Additionally, the high thermal conductivity ensures good dissipation of the losses. By utilizing an assembly technology as described in sections below including a power package for housing the vertical MOSFET cell 100 one or more embodiments overcome limitations in the assembly technology caused by insufficient thermal dissipation of conventional device packages.

The vertical MOSFET cell 100 may resist blocking voltages above 2000 V without being damaged. A blocking voltage of 2000 V, for example, may be handled by the vertical MOSFET cell 100 including an active region 105 of a thickness of about 20 µm. As silicon allows a blocking voltage of about 10 V per µm thickness of the active region, silicon carbide allows a 10 times higher blocking voltage. A blocking voltage of 100 V per µm thickness of the active region 105 corresponding to a blocking voltage of 2000 V requires an active region 105 having a thickness of about 20 µm. The vertical MOSFET cell 100 may be manufactured with a height reduction by a factor of 10 while supporting same limits of operation in terms of blocking voltage, thermal dissipation and maximum drain current.

In one embodiment, the vertical MOSFET cell 100 may include a support layer 104 formed of silicon having a high impurity concentration, for example of more than $10^{18}$ cm$^{-3}$. By using silicon carbide for the pn-junction inside the active region 105 of the power transistor 100 its characteristic material parameters in terms of on-state resistance and blocking voltage facilitate utilizing a support layer 104 having a higher impurity concentration as conventional support layers. The higher impurity concentration of the silicon support layer of e.g., more than $10^{18}$ cm$^{-3}$ manufactured by doping processes, for example, ion implantations, effects a smaller on-state resistance of the vertical MOSFET cell 100 which results in lower thermal losses in the power semiconductor 100.

In an embodiment the vertical MOSFET cell 100 as described above may include a support layer 104 formed of a first bandgap material which is different from silicon and an active region 105 of a second bandgap material formed on the surface of the support layer 104, which is different from silicon carbide, wherein the second bandgap is wider than the first bandgap. Silicon has a bandgap of about 1.11 eV (at 300K), silicon carbide (SiC) has a bandgap of about 2.86 eV. Other materials have even higher bandgaps, for example carbon (C) has a bandgap of about 5.5 eV, aluminium nitride (AlN) has a bandgap of about 6.3 eV, gallium nitride (GaN) has a bandgap of about 3.4 eV, zinc sulfide (ZnS) has a bandgap of about 3.6 eV.

Another embodiment of the vertical MOSFET cell may include a support layer 104 formed of silicon and an active region 105 of GaAs, aluminium nitride, diamond, gallium nitride, gallium phosphide or zinc sulfide. Another embodiment may include a support layer 104 formed of gallium arsenid GaAs (bandgap of about 1.43 eV) and an active region 105 of aluminium nitride, carbon, gallium nitride or zinc sulfide.

The support layer 104 may also include a plurality of support layers formed of different bandgap materials. The active region 105 may include a plurality of active regions formed of different bandgap materials, wherein at least one of the bandgap materials of the active region 105 has a wider bandgap than one of the bandgap materials of the support layer 104.

The support layer 104 may be formed of a material which is as inexpensive as silicon and the active region 105 may be formed of a material which is easy to deposit on the support layer in a semiconductor process, for example by a chemical vapor deposition processing or a physical vapor deposition process.

FIG. 2 illustrates a layer diagram of a trench MOSFET cell according to one embodiment. The trench MOSFET cell 200 includes a support layer 204 formed of silicon and an active region 205 formed of silicon carbide on the surface of the support layer 204. The trench MOSFET cell 200 includes a source terminal 201 corresponding to a first terminal, a drain terminal 202 corresponding to a second terminal and a gate terminal 203 corresponding to a control terminal. The source terminal 201 is connected to a source metallization layer 213 or a source electrode, respectively. The gate terminal 203 is connected to a gate electrode 214 and the drain terminal 202 is connected to a drain electrode 215. The active region 205 includes an $n^-$-doped epitaxial layer 210 or drift zone, respectively, on top of the support layer 204. The active region 205 further includes a p-zone 211 formed of p-doped SiC on top of the $n^-$-doped epitaxial layer 210 and two $n^+$-zones 212 formed of $n^+$-doped SiC arranged on top of the p-zone 211 such that a respective $n^+$-zone 212 contacts the source electrode 213 and a gate oxide layer 216 insulating the gate electrode 214 from the active region 205. The gate electrode 214 is formed as a trench inside the active region 205 insulated by the gate oxide layer 216 from the active region 205. The gate electrode 214 is insulated from the source electrode 213 by a gate source insulation layer 217.

The support layer 204 is formed of $n^+$-doped silicon and is arranged on a drain electrode 215 configured to electrically contact the support layer 204 to the drain terminal 202. The conductivity of the current path 206 inside the active region 205 formed of silicon carbide is influenced by a channel resistance $R_{channel}$ and by a drift zone resistance $R_{EPI}$. The drift zone resistance $R_{EPI}$ depends on the doping concentration of the epitaxial layer 210, whereas the channel resistance depends on the dimensioning and doping concentration of the channel formed in vertical direction between the $n^+$-zones 212 and the $n^-$ epitaxial layer 210 inside the p-zone 211 beneath the gate electrode 214 which is isolated by the gate oxide layer 216. pn-junctions are formed in the active region 205. The active region 205 formed of silicon carbide provides significantly lower static and dynamic losses enabling much larger power densities than active regions formed of silicon. Due to the greater breakdown field strength of silicon carbide, the active region 205 of the trench MOSFET cell 200 is by a factor of approx. 10 times thinner than a conventional trench MOSFET cell made of silicon. The about 10 times larger breakdown field strength of the silicon carbide active region 205 also enables a doping concentration two orders of magnitude lower than for a silicon trench MOSFET cell. This allows a realization of about 300 times smaller drift zone resistances $R_{EPI}$. Even at very high temperatures, the reverse leakage currents are very low allowing the application of the trench MOSFET cell 200 in high temperature environments. The high thermal conductivity of the trench MOSFET cell 200 in combination with a well suited power package as described in the later sections, makes the trench MOSFET cell 200 superior to a silicon trench MOSFET cell in terms of breakdown voltage and on-state resistance.

In other embodiments the power transistor can be a junction field effect transistor (JFET). An electric current 106, 206 flows from the source terminal 101, 201 to the drain terminal 102, 202. The gate terminal 103, 203 determines how much current 106, 206 flows. By applying an increasing negative (for an n-channel JFET) or an increasing positive (for a p-channel JFET), respectively, bias voltage to the gate terminal 103, 203, the current flow 106, 206 from source 101, 201 to drain 102, 202 can be impeded by pinching off the channel, in effect switching off the power transistor 100, 200. The JFET power transistor 100, 200 consists of an active region 105, 205 formed of SiC semiconductor material. This active region 105, 205 of SiC is doped so that it contains an abundance of positive charge carriers (p-type), or of negative charge carriers (n-type). There is a contact at each end; these are the source 113, 213 and drain 115, 215 (electrodes). The gate (electrode) connected to the control terminal 103, 203 surrounds the channel, and is doped opposite to the doping-type of the channel, forming a pn-junction at the interface of the two types of the SiC material inside the SiC active region 105, 205. In contrast to the illustrations depicted in FIGS. 1 and 2 the gate electrode 114, 214 is directly connected to the active region 105, 205 without having the gate oxide layer 116, 216 in order to effect pinching off of the channel.

In other embodiments the power transistor can be an insulated gate bipolar transistor (IGBT). An IGBT cell is constructed similarly to a n-channel vertical construction power MOSFET 100, 200 except the $n^+$-doped support layer 104, 204 formed of silicon utilized for contacting the drain electrode 115, 215 is replaced with a $p^+$-doped support layer 104, 204 formed of silicon. The $p^+$-doped support layer 104, 204 is utilized for contacting a collector electrode corresponding to the drain electrode 115, 215 as depicted in FIGS. 1 and 2, thus forming a vertical PNP bipolar junction transistor. The source electrode 113, 213 as depicted in FIGS. 1 and 2 corresponds for an IGBT device to the emitter electrode. This additional $p^+$-doped region creates a cascade connection of a PNP bipolar junction transistor with the surface n-channel MOSFET. While the PNP junction is arranged in the active region 105, 205 formed of SiC as well as in the support layer 104, 204 formed of Si, the n-channel MOSFET is arranged mainly in the active region 105, 205 formed of SiC without using the support layer 104, 204. This connection results in a significantly lower forward voltage drop compared to a conventional MOSFET in higher blocking voltage rated devices. As the blocking voltage rating of both MOSFET and IGBT devices increases, the depth of the n-drift region increases and the doping decreases, resulting in roughly square relationship increase in forward conduction loss compared to blocking voltage capability of the device. By injecting minority carriers (holes) from the collector $p^+$-doped region into the $n^-$-doped drift region during forward conduction, the resistance of the $n^-$-doped drift region is considerably reduced. The IGBT cell includes a gate oxide layer 116, 216 corresponding to the MOSFET cells 100, 200 in order to provide an insulation between the gate electrode and the active region.

In another embodiment, the trench MOSFET cell 200 may include a support layer 204 having a high impurity concentration, for example of more than $10^{18}$ cm$^{-3}$ to provide a high conductivity for a current path 206 between the source terminal 201 and the drain terminal 202.

In another embodiment the trench MOSFET cell 200 as described above may include a support layer 204 formed of a first bandgap material which is different from silicon and an active region 205 of a second bandgap material formed on the surface of the support layer 204, which is different from silicon carbide, wherein the second bandgap is wider than the first bandgap.

The support layer 204 may also include a plurality of support layers formed of different bandgap materials, the active region 205 may include a plurality of active regions formed of different bandgap materials, wherein at least one of the bandgap materials of the active region 205 has a wider bandgap than one of the bandgap materials of the support layer 204.

Figure 3:
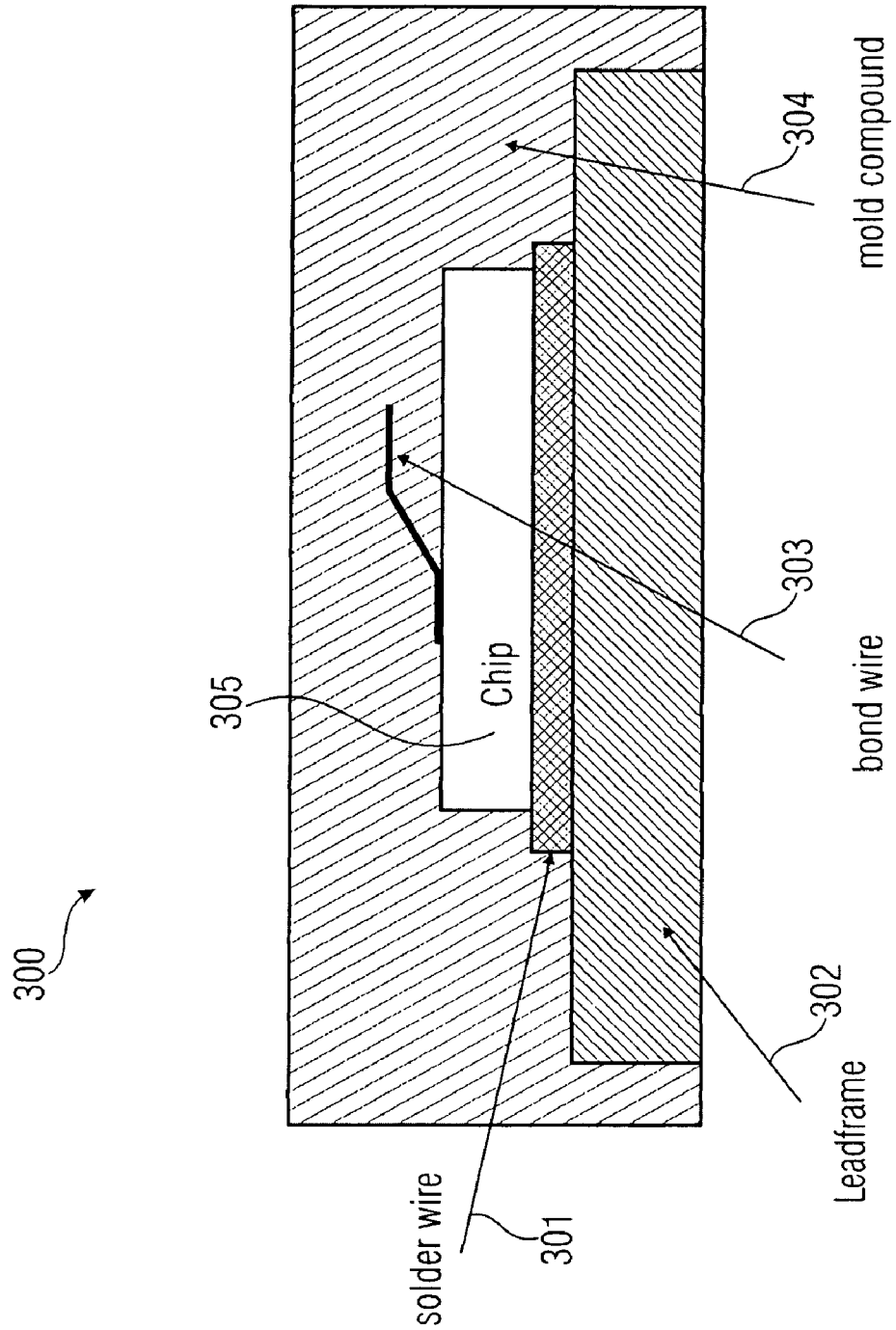
FIG. 3 illustrates a schematic representation of a sectional view of a power package according to one embodiment.

FIG. 3 illustrates a schematic representation of a sectional view of a power package according to one embodiment. The power package 300 includes a power transistor or a chip 305, respectively, corresponding to the vertical MOSFET cell 100 depicted in FIG. 1 or corresponding to the trench MOSFET cell 200 depicted in FIG. 2. The power package 300 further includes a leadframe 302 made of metal which is configured to electrically couple the chip 305 by contacting its gate, source and drain electrodes. A solder wire 301 may be used for coupling the leadframe 302 with the backside of the chip 305. The power package 300 includes bond wires 303 for coupling the surface electrodes of the chip 305 to the leadframe 302. The leadframe 302 may include a soldering pad for coupling the backside of the chip 305 and may further include bonding pads for coupling the electrodes on the surface of the chip 305 by bonding wires 303. The chip 305 includes an electrode formed on the backside of the chip 305 which is mounted by a solder wire 301 onto the leadframe 302 and provides a main area for a thermal power dissipation. The chip 305 may be surface-mounted or flip-chip mounted to the leadframe 302. The electrode contacting the leadframe 302 on a main area of the leadframe 302 specifies the main area for thermal power dissipation. This may be an electrode arranged on the active region 105, 205 or an electrode arranged on the support layer 104, 204, for example a drain electrode coupled to a drain terminal being at ground potential or a source electrode coupled to a source terminal being at ground potential. A mold component 304 is used for mechanically and electrically protecting the chip 305. The mold compound is formed around the chip/leadframe device such that the backside of the power package 300 corresponding to the contacting side of the leadframe 302 is not covered by molding mass.

One or more embodiments provide a power package 300 including a leadframe 302 which is directly mounted onto a heatsink without utilizing an insulation layer between the leadframe 302 and the heatsink so that the thermal power of the chip 305 may be dissipated from the electrode at the backside of the chip through the leadframe 302 to a heatsink.

By this an additional thermal resistance caused by an insulation layer may be avoided resulting in a better thermal dissipation of the power package 300.

Figure 4:
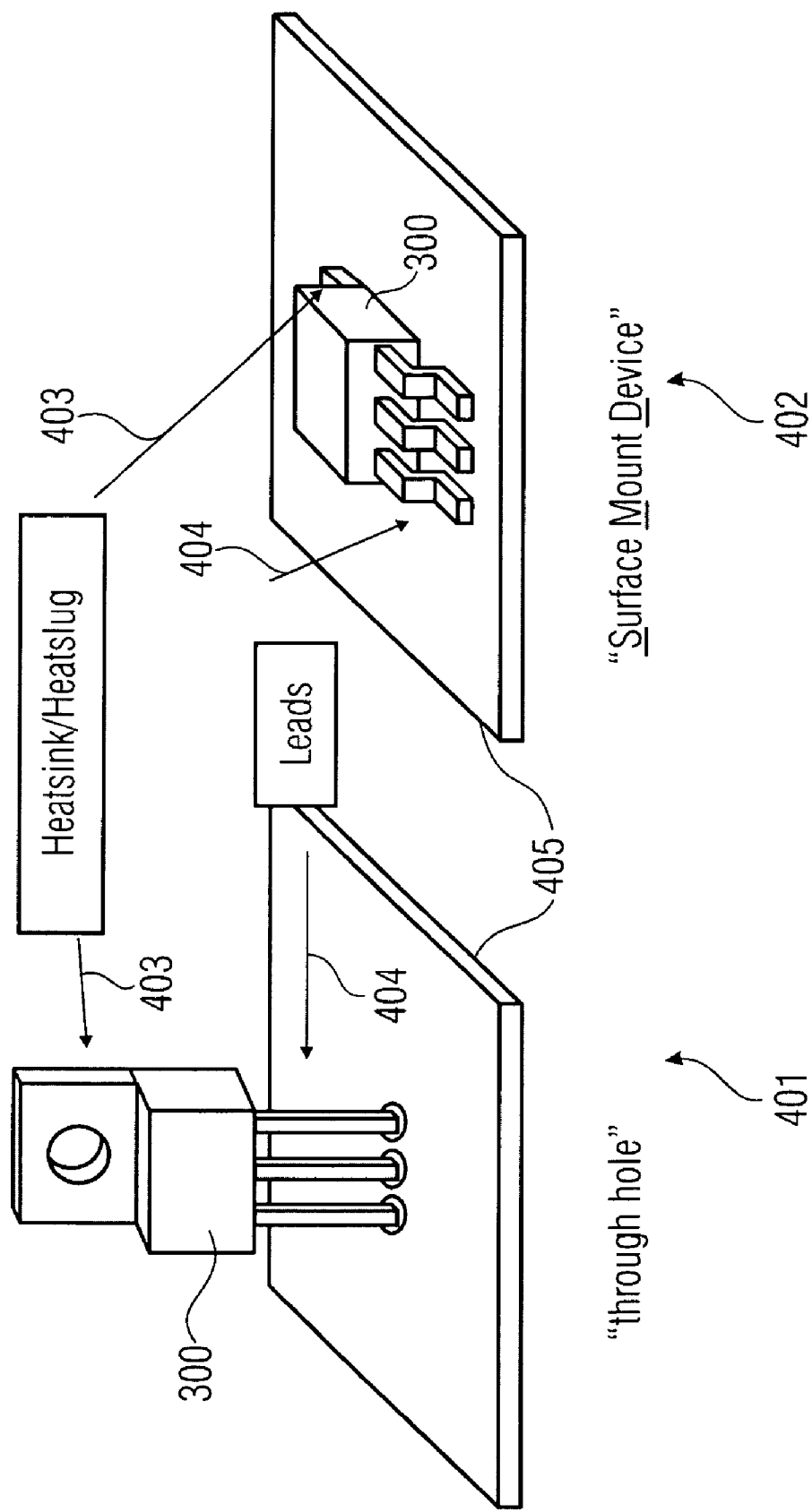
FIG. 4 illustrates a schematic representation of a surface view of two device packages according to one or more embodiment.

The mounting technique of the leadframe 302 onto the heatsink is depicted in FIG. 4.

FIG. 4 illustrates a schematic representation of a surface view of two device packages according to one or more embodiments. A first mounting technique providing a through-hole device package 401 contacts the strip lines of the leadframe 404 with a printed circuit board 405 by mounting the the strip lines into holes in the printed circuit board 405. A heatsink 403 is mounted on the backside of the power package 300 not contacted to the printed circuit board 405, such that the heatsink 403 may dissipate its thermal power directly to the surrounding air.

A surface mounted device package 402 connects the power package 300 to the printed circuit board 405 by mounting the backside of the power package 300 onto the heatsink 403 and the heatsink 403 onto the printed circuit board 405. The heatsink 403 may dissipate its power from the power package 300 directly to the printed circuit board 405 without an insulation layer degrading the thermal performance. The heatsink 403 is dimensioned to exchange the thermal power from the power package 300 with the printed circuit board 405 by a contacting area of sufficiently large size. In another variation the power package 300 is directly mounted onto the printed circuit board 405 without an insulation layer, the printed circuit board 405 functioning as the heatsink.

The power package 300 may include a p-channel MOSFET having a drain electrode 115, 215 forming the backside of the power package 300, wherein the drain electrode 115, 215 is contacted to the leadframe 404 which is directly mounted onto the heatsink 403 without utilizing an insulation layer between the leadframe 404 and the heatsink 403. The backside of the power package 300 may be coupled to a ground potential such that the main power dissipation is effected by the drain electrode on the backside of the power package 300. A p-channel high voltage power MOSFET may be used for power factor correction (PFC) applications wherein the source terminal carries a high voltage and the drain terminal carries a ground (low) voltage. By directly coupling the backside of the chip 305 carrying the (low) drain voltage with the heatsink, an insulation layer may be omitted which results in a significant reduction of the thermal resistance between junction and case and, therefore, resulting in an increased maximum power dissipation of the power semiconductor. Contacting the backside of the chip 305 directly with the heatsink 403 improves the power dissipation of the power transistor according to one or more embodiments which may be exploited in power factor correction (PFC) applications. The power transistor may be, for example, a 600V-CoolMOS semiconductor housed in a TO220-PAK device package avoiding an electrical isolation between the chip backside and the heatsink. A 500V or 600V p-channel power MOSFET in a standard TO 220 device package without an insulation allows contacting the chip backside by the leadframe and therefore the backside of the power package 300 with the electrical ground potential and enables a direct mounting of the power MOSFET onto the heatsink. By avoiding the electrical insulation, the thermal resistance between junction and case may be reduced from e.g., 2-4 K/W (for a TO220FP standard device package) to about 0.5-1 K/W (for a TO 220 standard device package). Such a p-channel power MOSFET allows a significant increase of the maximum power dissipation depending on the specific heatsink. Besides a 500/600V p channel MOSFET allows a face-down mounting of a power diode necessary for PFC applications directly onto the p-channel MOSFET.

One embodiment of a method for producing a power transistor having a first terminal, a second terminal and a control terminal includes "forming a support layer of a first bandgap material" and "forming an active region of a second bandgap material having a wider bandgap than the first bandgap material on a surface of the support layer, the active region being arranged to form part of a current path between the first and second terminal in a forward mode of operation and to form a pn-junction in the active region".

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power transistor comprising:
a first terminal, a second terminal and a control terminal;
a support layer formed of a first material having a first bandgap; and
an active region formed of a second material having a second bandgap wider than the first bandgap, the active region disposed on the support layer,
wherein the active region is arranged to form part of a current path between the first and second terminals in a forward mode of operation,
wherein the active region includes at least one pn-junction,
wherein the pn-junction includes a p region and an n region,
wherein the p region and the n region are formed of the second material, and
wherein a layer of the active region bordering on the support layer and the support layer are of the same doping type.

2. The power transistor of claim 1, wherein the first material includes silicon.

3. The power transistor of claim 1, wherein the second material includes at least one material selected from the group consisting of silicon carbide, carbon, GaN, GaP, GaAs, AlN, and ZnS.

4. The power transistor of claim 1, wherein the first material is silicon and the second material is silicon carbide.

5. The power transistor of claim 1, wherein the support layer comprises an impurity concentration of more than $10^{18}$ $cm^{-3}$.

6. The power transistor of claim 1, wherein the active region comprises an epitaxial layer formed by an epitaxial process.

7. The power transistor of claim 1, wherein the power transistor is a lateral or vertical diffused MOSFET or IGBT, and wherein the control terminal is coupled to a gate electrode separated from the active region by an insulation layer.

8. The power transistor of claim 1, wherein the power transistor is a JFET,
wherein the control terminal is coupled to a gate electrode contacting the active region.

9. The power transistor of claim 1, wherein the active region comprises a p-doped zone, an n+-doped zone and an n− epitaxial layer, the p-doped zone being configured to form a channel region between the n+-doped zone and the n− epitaxial layer; or wherein the active region comprises a n– doped zone, a p–-doped zone and a p+ epitaxial layer, the n–-doped zone being configured to form a channel region between the p–-doped zone and the p+ epitaxial layer.

10. The power transistor of claim 1, wherein a thickness of the active region is greater than a thickness of the support layer.

11. The power transistor of claim 10, wherein the thickness of the active region is greater than 5 µm.

12. The power transistor of claim 11, wherein the active region is configured to resist blocking voltages greater than 500V.

13. A power package comprising:
a power transistor comprising a first terminal, a second terminal and a control terminal, a support layer formed of a first material having a first bandgap, and an active region formed of a second material having a second bandgap wider than the first bandgap, the active region disposed on the support layer, wherein the active region is arranged to form part of a current path between the first and second terminal in a forward mode of operation, wherein the active region includes at least one pn-junction, wherein the pn-junction includes a p region and an n region, wherein the p region and the n region are formed of the second material, and wherein a layer of the active region bordering on the support layer and the support layer are of the same doping type,
the power package further comprising:
a leadframe of metal configured to electrically and thermally couple the power transistor; and
a mold component for protecting the power transistor,
wherein the leadframe is directly mounted onto a heatsink without utilizing an insulation layer between the leadframe and the heatsink.

14. The power package of claim 13, wherein the leadframe is through hole mounted on a printed circuit board, the heatsink not being contacted to the printed circuit board.

15. The power package of claim 13, comprising:
wherein the leadframe is surface mounted on a printed circuit board, the heatsink being contacted to the printed circuit board.

16. The power package of claim 13, wherein the power transistor is a p channel HV MOSFET comprising a drain metallization layer contacting the support layer and being configured to electrically and thermally couple the support layer with the leadframe, the drain metallization layer providing a main area for thermal power dissipation.

17. The power package of claim 16, wherein the power transistor is a 500/600 V p-channel Power MOSFET, the power package having a junction-case thermal resistance in the range of 0.5 K/W to 1 K/W.

18. A method of forming a power transistor having a first terminal, a second terminal and a control terminal, the method comprising:
forming a support layer having a first bandgap; and
forming an active region on the support layer, the active region having a second bandgap wider than the first bandgap, the active region arranged to form part of a current path between the first and second terminals in a forward mode of operation, the active region including at least one pn-junction, wherein the pn-junction includes a p region and an n region, wherein the p region and the n region are formed of the second material, and wherein a layer of the active region bordering on the support layer and the support layer are of the same doping type.

19. The method of claim 18, wherein the support layer is formed of a first material, and wherein the first material includes silicon.

20. The method of claim 18, wherein the active region is formed of a second material, and wherein the second material includes at least one material selected from the group consisting of silicon carbide, carbon, GaN, GaP, GaAs, AlN, and ZnS.

21. The method of claim 18, wherein the support layer is formed of a first material, wherein the first material is silicon, and the active region is formed of a second material, wherein the second material is silicon carbide.

22. A power semiconductor device package comprising:
a power transistor comprising a first terminal, a second terminal and a control terminal, a support layer formed of a first material having a first bandgap, and an active region formed of a second material having a second bandgap wider than the first bandgap, the active region disposed on the support layer, wherein the active region is arranged to form part of a current path between the first and second terminal in a forward mode of operation, wherein the active region includes at least one pn-junction, wherein the pn-junction includes a p region and an n region, wherein the p region and the n region are formed of the second material, and wherein a layer of the active region bordering on the support layer and the support layer are of the same doping type,
the power package further comprising:
a leadframe of metal configured to electrically and thermally couple the power transistor; and
a mold component for protecting the power transistor,
wherein the leadframe is directly mounted onto a heatsink without utilizing an insulation layer between the leadframe and the heatsink.

* * * * *